United States Patent [19]

Dalrymple et al.

[11] Patent Number: 5,193,199
[45] Date of Patent: Mar. 9, 1993

[54] DEVICE AND METHOD FOR PROGRAMMING CRITICAL HARDWARE PARAMETERS

[75] Inventors: Monte J. Dalrymple, Fremont; Don Smith, Los Gatos; Lois F. Brubaker, Newark, all of Calif.

[73] Assignee: Zilog, Inc., Campbell, Calif.

[21] Appl. No.: 742,152

[22] Filed: Aug. 1, 1991

Related U.S. Application Data

[63] Continuation of Ser. No. 181,742, Apr. 14, 1988, abandoned.

[51] Int. Cl.⁵ .................... G06F 9/22; G06F 13/10
[52] U.S. Cl. .................... 395/775; 364/280.2; 364/975.2
[58] Field of Search .................... 364/200, 900

[56] References Cited

U.S. PATENT DOCUMENTS

| | | | |
|---|---|---|---|
| 4,228,502 | 10/1980 | Wakasugi | 364/200 |
| 4,263,650 | 4/1981 | Bennett et al. | 364/200 |
| 4,342,084 | 7/1982 | Sager et al. | 364/200 |
| 4,354,229 | 10/1982 | Davis et al. | 364/200 |
| 4,370,728 | 1/1983 | Coffron | 364/900 |
| 4,405,982 | 9/1983 | Ruhnau et al. | 364/200 |
| 4,409,671 | 10/1983 | Daniels et al. | 364/900 |
| 4,430,704 | 2/1984 | Page et al. | 364/200 |
| 4,468,729 | 8/1984 | Schwartz | 364/200 |
| 4,517,661 | 3/1985 | Graf et al. | 364/900 |
| 4,615,005 | 9/1986 | Maejima et al. | 364/200 |
| 4,628,448 | 12/1986 | Murao | 364/200 |
| 4,635,192 | 1/1987 | Ceccon et al. | 364/200 |
| 4,653,034 | 3/1987 | Hoover et al. | 367/131 |
| 4,663,707 | 5/1987 | Dawson | 364/200 |
| 4,698,750 | 10/1987 | Wilkie et al. | 364/200 |
| 4,718,007 | 1/1988 | Yukimo | 364/200 |
| 4,718,064 | 1/1988 | Edwards et al. | 364/200 |
| 4,766,530 | 8/1988 | Roslund | 364/200 |
| 4,811,345 | 3/1989 | Johnson | 364/200 |
| 4,825,407 | 3/1989 | Loessel et al. | 364/900 |
| 4,831,513 | 5/1989 | Kanazawa | 364/200 |
| 4,841,440 | 6/1989 | Yonezu et al. | 364/200 |
| 4,931,723 | 6/1990 | Jeffrey et al. | 371/22.3 |
| 5,031,091 | 7/1991 | Wakatsuki et al. | 364/200 |

Primary Examiner—Arthur G. Evans
Assistant Examiner—C. Shin
Attorney, Agent, or Firm—Majestic, Parsons, Siebert & Hsue

[57] ABSTRACT

A control register residing in a circuit chip stores a set of hardware parameters which exercise programmable control over circuits in the chip to allow for various critical hardware options. A plurality of chips and their control registers may be addressed and written individually by a processor through normal bus access. Each control register is permitted to be written only once, shortly after reset. A circuit, in response to a reset signal and a chip select signal, enables the individual control register for writing, and further, in response to a write strobe, latches data from the data bus into the register and soon afterwards ceases enabling the register for further writes. The various hardware options responsive to the hardware parameters include allowing for various bus interfaces, trimming the time constant of an analog RC circuit which provides internal bus timing strobes, switching internal timing strobes to external pads for output, switching external timing strobes from external pads to replace the internal strobes, and floating the outputs of all output pad drivers for junction leakage tests.

4 Claims, 6 Drawing Sheets

DEVICE AND METHOD FOR PROGRAMMING CRITICAL HARDWARE PARAMETERS

This is a continuation of application Ser. No. 07/181,742, filed Apr. 14, 1988, now abandoned.

BACKGROUND OF THE INVENTION

This invention relates in general to digital computer systems, and more particularly to a control register in a peripheral chip.

Digital data is represented by binary bits. Microprocessors typically operate on a number of bits of data in parallel. For example, a microprocessor chip may have eight data lines connected to it so that eight binary bits of digital information may be received or transmitted in parallel at any one time.

For communication between a microprocessor and a peripheral device such as a modem, a printer or a data acquisition instrument, it is often expedient for digital data to be carried in a single line connecting between them. In order to do this, the parallel data from the microprocessor must be converted to a serial bit stream for transmission over a cable.

In simpler applications, a "stand-alone" chip commonly known as UART (Universal Asynchronous Receiver/Transmitter) is used to convert digital data between parallel and serial forms.

In more sophisticated applications, a microprocessor-controlled version of the UART is used. It is a software programmable serial microprocessor peripheral chip (commonly known as USART). The operating mode of a USART is programmable through the bus under the control of a processor. Examples of operating modes options are choices of clock sources, clock rates, choice of asynchronous or synchronous mode, and specification of data encoding format The controlling parameters are stored in a regular register set residing in the peripheral chip. This regular register set is addressable at any time via normal bus access by the CPU.

While most USART's offer a programmable choice of serial port operating modes, they are generally quite specific about the microprocessors they may be interfaced with, and indeed most CPU (Central Processor Unit) families have their own USART. They also do not offer these same programmable provisions for certain critical hardware parameters of the chip. These hardware parameters control the basic characteristics of the chip and do not change in between hardware resets. For example, by setting the appropriate hardware parameters, the peripheral chip could be put in special test or diagnostic modes. Another hardware parameter may be use to make the chip compatible with either an 8-bit or 16-bit interface. Yet another set of parameters may be used to fine-tune the timing characteristics of the chip.

A few of the peripheral chips do provide a very limited way of selecting between alternative hardware options. One way is to provide for bonding options at the factory level If two alternative options are desired, the common circuit as well as the two alternative modification circuits are built into the same chip so that the factory has the option of physically bonding one set or the other to the common circuit as required.

Another way, which provides more flexibility at the user level, is to provide for dedicated pins on chips so that a user can select between the options by programming at the board level by making physical connection from one pin to another.

Yet another way of exercising the various hardware options is to allow for a limited degree of software programmability. Typically, the critical hardware parameters are stored in special registers in the peripheral chip. Unlike the earlier regular type of registers, these special registers cannot be addressed nor set via a normal bus access. Their general inaccessibility helps to insulate against any software errors at run time from affecting the critical hardware parameters. These special registers are normally only settable right after reset. Typically certain pins (a data bus for example) are sampled at the end of the reset cycle, and the controlling parameters are written into the special registers. As the writing of the register is not done with a normal write cycle, dedicated hardware is needed to force the necessary pins to the appropriate values at the end of the reset cycle. This method is cumbersome, and makes the individual programming of more than one peripheral chip impractical.

Accordingly, it is a primary object of the invention to provide an improved method and device which allow the various hardware options of a chip, which are invariant between resets, to be programmably controlled by the content of a control register in the chip and that the control register be addressable and writable through normal bus access, only once after system reset.

SUMMARY OF THE INVENTION

This and additional objects are accomplished by the various aspects of the present invention, wherein, according to one aspect thereof, a control register residing in an integrated circuit stores a set of hardware parameters which control circuits in the chip for allowing various hardware options. The control register is connected to an address/data bus so that its contents are written therein by standard bus access with a. processor. A plurality of chips may be individually addressed and their control registers written by the processor. A circuit, in response to a reset signal and a chip select signal, enables an individual control register for writing, and then, in response to a write strobe, ceases enabling after the hardware parameters have been written. This permits each control register to be written only once shortly after reset.

According to another aspect of the invention, responsive to one of the hardware parameters in the control register, the circuit chip assumes an 8-bit or a 16-bit address/data bus.

According to yet another aspect of the invention, responsive to one of the hardware parameters in the control register, the circuit chip assumes a multiplexed address/data bus or separate buses for address and data.

According to yet another aspect of the invention, responsive to a group of the hardware parameters in the control register, the internal strobe width of the circuit chip may be adjusted. The timing of the internal strobe is determined by the RC time constant of a 'one shot' monostable multivibrator in the chip. A circuit with a bank of trimming capacitors is used to modify the value of the main capacitor in the 'one shot', thereby adjusting the time constant of the RC circuit. Each trimming capacitor is switchably shunted onto the main capacitor. The switching of individual trimming capacitors is responsive to a certain combination of the group of hardware parameters in the control register.

According to yet another aspect of the invention, responsive to one of the hardware parameters of the control register, a circuit in the chip allows control of internal bus timing by replacing the internal strobes with external ones fed in from an external pad. The circuit acts as a multiplexer responsive to the control parameter and connects either the internal strobe generator or the external pad to the internal strobe line.

According to yet another aspect of the invention, responsive to one of the hardware parameters of the control register, a circuit in the chip allows output of the internal bus timing strobes to an external pad. The circuit acts as a multiplexer responsive to the control parameter and connects either the original line or the internal strobe line to the external pad.

According to yet another aspect of the invention, responsive to one of the hardware parameters of the control register, the set of output pad drivers can simultaneously have their outputs put in an open state, thereby allowing testing for junction leakage of the pad drivers.

The various aspects of the present invention described herein being are commercially embodied in the Z16C30 CMOS Universal Serial Controller integrated circuit chip of Zilog, Inc., Campbell, California, assignee of the present application.

Additional objects, features and advantages of the present invention will become apparent from the following description of a preferred embodiment thereof, which description should be taken in conjunction with the accompanying drawings.

DETAILED DESCRIPTION OF THE PREFERRED EMBODIMENT

Figure 1:
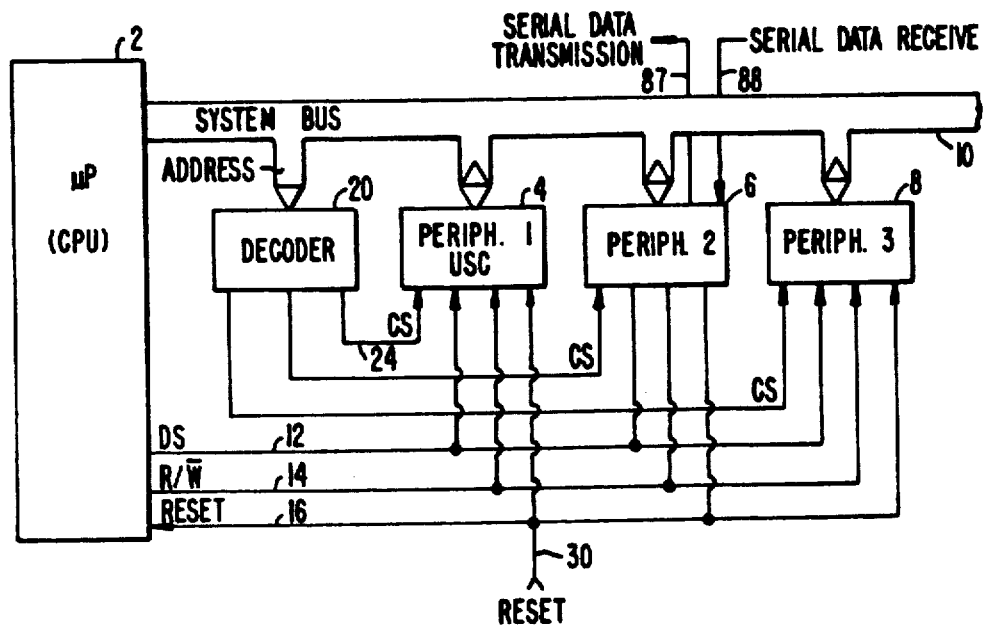
FIG. 1 illustrates the system in which a peripheral chip embodying the various aspects of the present invention is used.

An example peripheral chip selected to illustrate the various aspects of the present invention will be referred to as the Universal Serial Controller Referring to FIG. 1, the system in which the peripheral chip is used is shown in block schematic diagram form. A Central Processor Unit (CPU) 2 and a host of peripheral chips 4, 6, 8 are interconnected by a system bus 10. Typically a digital computer system contains several of these peripheral chips which serve as either serial ports or parallel ports. As shown in FIG. 1, for the peripheral chip 4 to be used as a serial port, a peripheral chip of the present invention would be used. The system bus 10 contains address, data, and control lines. However, for illustrative purposes, some control lines of interest are drawn explicitly outside the system bus 10. These control lines are Data Strobe (DS) 12, Read/Write Status (R/W*) 14, and Reset 16.

Each of the peripheral chips has a specific address addressable by the CPU 2. For example, to communicate with the peripheral chip 4, the CPU 2 first puts out the address of the peripheral 4 on the system bus. This address is decoded by a decoder 20 as an active High in the Chip Select line (CS) 24 to enable the peripheral chip 4. With the peripheral chip 4 enabled, the CPU 2 then issues a Data Strobe (DS) along line 12 to initiate the transfer of data between the system bus 10 and peripheral chip 4. The status of R/W* 14 will specify whether it is a read operation or write operation.

FIG. 1 also illustrates a hardware reset for the system. A line 30 is connected to the reset input of the CPU 2 as well as all of the peripheral chips 4, 6 and 8. When the line 30 is activated by the user or from power-up circuits, the system will go into a predefined initial state.

Figure 2:
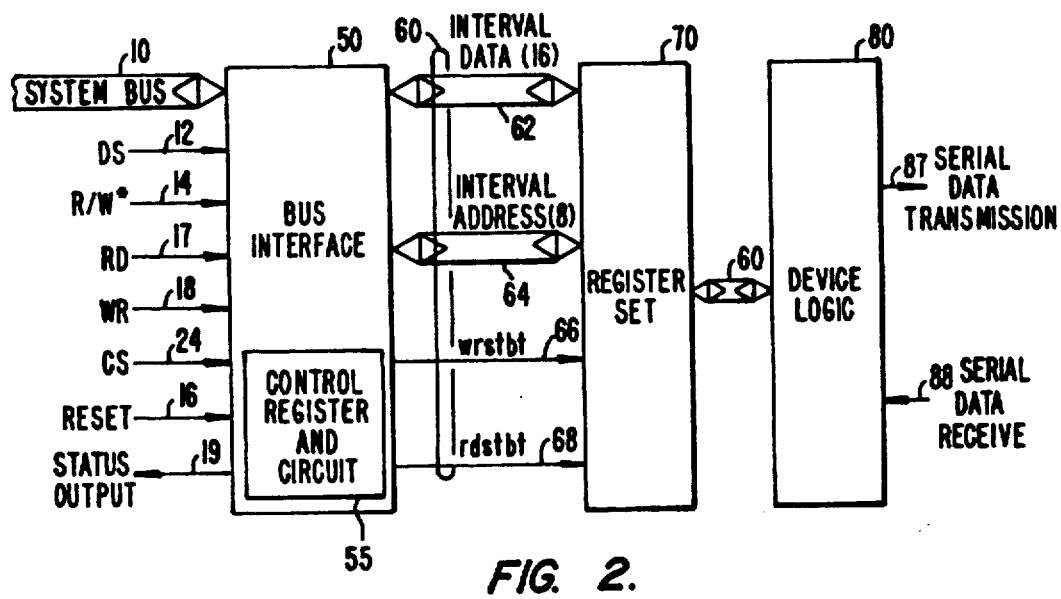
FIG. 2 is a schematic diagram illustrating the functional blocks of the peripheral chip.

Referring to FIG. 2, the architecture of the chip is shown in schematic block diagram form. A Bus interface 50 connects to the external system bus 10 on the one hand, and on the other, to an internal register set 70 and a device logic 80 via an internal bus 60. As in FIG. 1, the system bus 10 going into the bus interface 50 contains address and data, as well as control lines. Similarly, some of the control lines are drawn explicitly out of the system bus 10 for illustrative purposes. As before, data strobe line (DS) 12, read/write line (R/W*) 14, reset line 16 and chip select line (CS) 24 are drawn explicitly In addition, a read strobe line (RD) 17, write strobe line (WR) 18 and status output line 19 are also drawn explicitly. These will be useful for discussion later on. Similarly, the internal bus 60 comprises an internal data bus 62, an internal address bus 64, and various control lines In the present embodiment, the internal data bus 62 is 16 bits wide and the internal address bus 64 is 8 bits wide. Two control lines are also drawn explicitly, namely, WRSTBT 66 and RDSTBT 68. These are used for timing internal bus transactions and are discussed later.

The Universal Peripheral Controller chip serves to convert between parallel data and serial data. Schematically, parallel data from the system bus 10 enters or leaves the peripheral chip through the bus interface 50, and the serial data exits the peripheral chip a line 87 and enters through a line 88. The peripheral chip illustrated in FIG. 2 is, of course, packaged in some appropriate way (not shown) with conductive pins extending from the package and connected to the circuit chip.

One important feature of the present invention is the implementation of a control register in the peripheral chip. Various hardware options of the peripheral chip can be selected according to the register bits. To set the bits in the control register, the CPU can write to it via normal bus access but only immediately after system reset. The control register and related circuit are schematically shown as a block 55 residing within the Bus interface 50.

Figure 3:
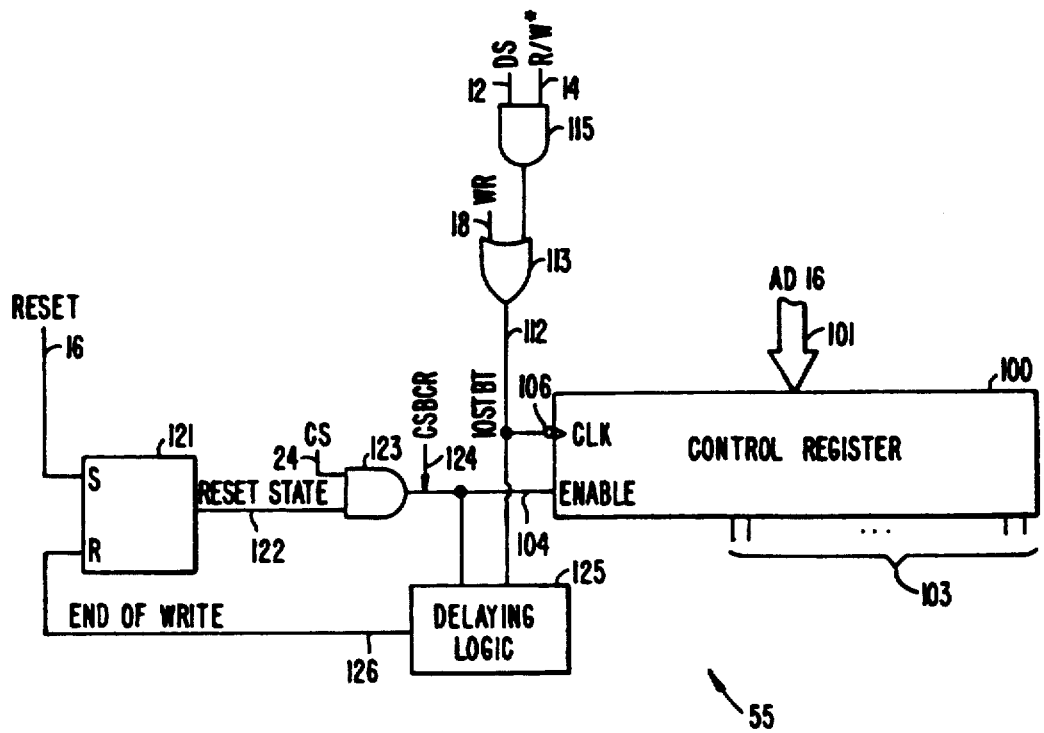
FIG. 3 is a circuit to implement the once accessible control register.

A more detailed circuit diagram of the control register and circuit 55 is shown schematically in FIG. 3. A control register 100 is connected to the address/data lines 101 which are part of the system bus 10 illustrated in FIG. 1 and FIG. 2. In the preferred embodiment, there are 16 address/data lines, forming 16 inputs to a 16 bit control register 100. The 16-bit content of the register is available at an output 103 with 16 pins, one for each bit. Two other inputs to the control register 100 control the latching of the register from the address/data lines 101. The first input 104 when active, enables control register 100 for latching. The other input 106 is a clock input to execute the latching with the trailing edge of a clock signal.

Two events must occur in order for the control parameters available on the address/data lines 101 to be written into the control register 100. First, the control register 100 must be enabled with an active High into the input 104. Secondly, the CPU must issue a strobe signal to the control register 100 through the input 106 to latch in the control parameters.

Figure 4:
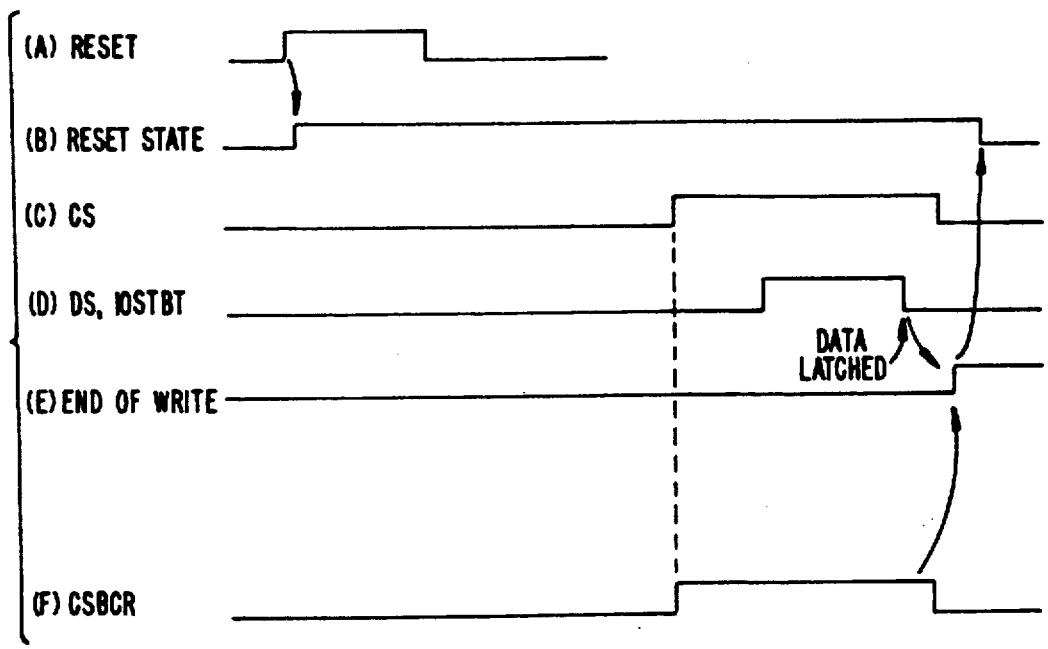
FIGS. 4(A) through 4(F) are timing diagrams of the circuit of FIG. 4.

The latching of control parameters into the register 100 is contingent on it being enabled. In order to prevent possible run-time software errors from inadvertently altering the contents of the control register 100, it is allowed to be written only once after reset. Thereafter, no further access is possible until the next reset. To have this property, the control register 100 is normally disabled for writing except immediately after reset. In order to describe the circuit of FIG. 3 clearly, the timing diagrams of FIG. 4 should be referred to at the same time. When the signal in the reset line 16 goes active High, the rising edge of the signal enters the Set input 16 of a Set/Reset (SR) latch 121 (FIG. 4(A)). This sets the output 122 of the SR latch 121 High (FIG. 4(B)) and the state is stored there until the latch 121 is reset again. At the same time, the High state enables an AND gate 123 to await the arrival of an active signal from the CS line 24 to enable the control register 100. Thus any time after reset is active, and when the CPU chooses to write to the control register of a given peripheral chip, it makes the particular chip selection by the usual address decode. An active High signal in the CS line 24 will then go through the AND gate 123 as a High in the CSBCR line 124 and thus enables the control register 100 for writing by the CPU (FIG. 4 (C), (F)).

Once the control register 100 has been enabled for writing, the second event described earlier must take place to latch the data in. The CPU first makes the data available on the address/data bus 101, and issues a write strobe, the trailing edge of which latches data into the control register 100. Depending on the type of microprocessor used, the write strobe can assume one of two protocols. In one protocol, the status of the R/W* line 14 specifies whether it is a read or write operation, and the strobe signal is carried by another control line DS 12. The alternative protocol is to have dedicated lines for read and write separately. Thus for write operations, the strobe signal is carried in the control line WR 18. Similarly, for read operations, the strobe signal is carried in the control line RD 17 (not shown in FIG. 3 but shown in FIG. 2). Under either protocol, the strobe signal is used to clock the control register 100 for latching to or from the address/data bus 101.

The circuit of FIG. 3 illustrates an arrangement which will accept strobe signals from either protocol. Under the first one, the R/W* line 14 active Low will enable an AND gate 115 and let the strobe signal carried in the DS line 12 to go through. The strobe signal in turn passes through an OR gate 113 to become the signal in IOSTBT line 112 which goes into the input 106 to clock the control register 100 (FIG. 4 (D)). Under the second protocol, the strobe signal carried along the WR line 18 passes through the OR gate 113 to become the signal in IOSTBT line 112 and goes into the input 106 to clock the control register 100 as before.

Once the control register 100 has been written to, it is necessary to disable the writing of the control register 100 in order to ensure that no further writes are possible until the next system reset. Shortly after the strobe signal in the IOSTBT line 112 has subsided, the input 104 must return to Low to disable the control register 100. This is effected by a delaying logic 125. Shortly after sensing the trailing edge of the strobe signal in the IOSTBT line 112 in conjunction with the CSBCR line 124 High, the delaying logic 125 issues a High End of-write signal from its output 126 to the reset input of the SR latch 121. (FIG. 4 (D), (E), (F)). In this way a Low state is stored at the output of the SR latch 121 (FIG. 4 (B)) which serves to disable an AND gate 123 and block the CS line 24 signal thereby disabling further writing of the control register 100. By this scheme, the time window for writing into the control register 100 begins only after both active signals for the reset line 16 and the chip select line 24 have been issued, and ends shortly after the strobe in the DS line 12 or the WR line 18 arrives to clock control register 100. The time window is represented by the CSBCR line High in FIG. 4 (F).

As mentioned earlier, in prior art method, the limited accessibility of the control register is achieved by preventing it from being written through normal bus access. This method requires dedicated hardware drivers to force the necessary pins to the appropriate values at the end of the reset cycle in order to program the control register. This also makes the programming of more than one chip with these control registers impractical since, save the one being programmed at the time, all other peripheral chips and their dedicated hardware drivers must be decoupled from the pins.

Despite the limited accessibility of the control register, one feature of the present invention is that when it does get written, unlike prior art, it is written under normal bus protocol. This feature, in conjunction with the address decoded chip select, allows the CPU to individually address and load the control registers of a plurality of chips in the system. Referring back to FIG. 1, and supposing peripheral chips 4, 6, 8 are all chips containing control registers, it is possible for the CPU 2 to load different sets of control parameters into the control register of each of these chips.

Figure 5:
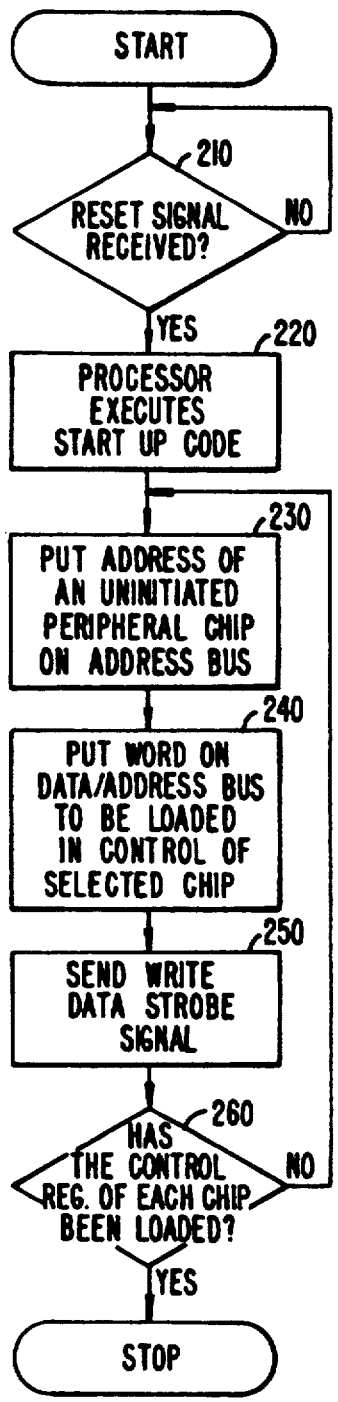
FIG. 5 is a flow diagram of the CPU operation to load the control register of the peripheral chip.

This operation of the CPU in some detail can best be understood by reference to the flow diagram of FIG. 5. In the first step 210, the CPU is continuously monitoring a reset signal which could have been sent by a user. Upon issuance of such a signal, the system goes into a reset mode in the next step 220, and the CPU 2 begins initiation of the system by executing a start-up code. Next, in a step the CPU puts the address of an uninitiated peripheral chip on the address/data bus. This address gets decoded as an active High in chip select line (CS) to enable the addressed peripheral chip and the control register in particular. The CPU then puts the control parameters as data on the address/data bus in the next step 240. In the next step 250, it sends a write data strobe signal to the peripheral chips. This latched the data from the bus into the selected peripheral chip control register.

Thereafter, the just written peripheral chip control register is disabled for further write. In the next step 260, the CPU checks for additional peripheral chips in the system which contain registers which are also required to be loaded. If there are more, the CPU repeats the earlier steps 230, 240 and 250 until all the control registers of every addressed chip have been loaded, whereupon, the loading operation of the CPU on the peripheral chips stops. Of course, if the accessed register is of the type of the present invention, its circuit logic will prevent it from further access. The same is not true for regular types of registers which may also exist in the system.

As mentioned before, the control register 100 illustrated in FIG. 3 is chosen to be a 16 bit register in the preferred embodiment. The value of the control parameters loaded into the control register 100 are available at its output pins 103. These are used to control various hardware characteristics of the peripheral chip.

Figure 6:
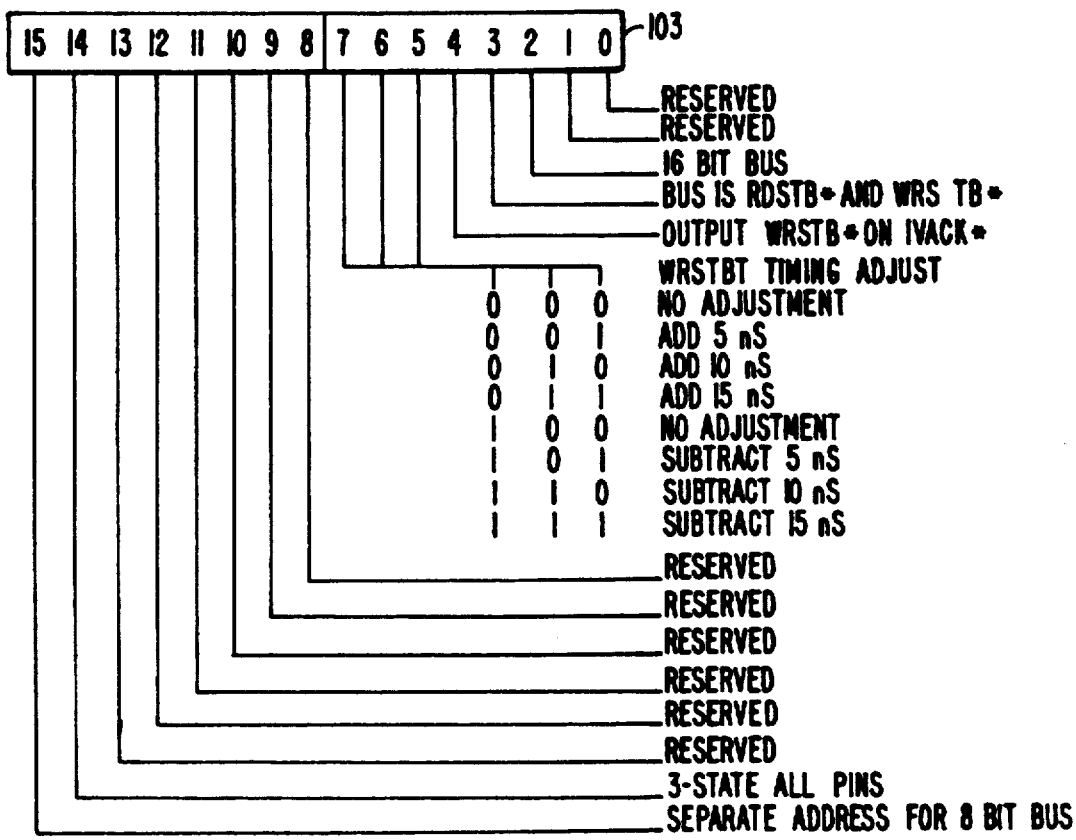
FIG. 6 illustrates the allocation of the various controlling parameters in the control register.

FIG. 6 shows some examples of how the controlling bits are utilized in the peripheral chip. Bit 2 is used to specify whether an 8-bit or 16-bit address/data bus is used. For example if bit 2 or output pin 2 is High, and data strobe is active, the contents on all the 16 lines of the address/data bus will be interpreted as data. If bit 2 is Low, only the lower 8 lines of the address/data bus will be interpreted as data. In the present embodiment, there are only 8 address lines and when address strobe is active the lower 8 lines of the address/data bus will always be interpreted as address. On the other hand, output pin 15 controls whether the address and data buses are separate or multiplexed. This applies to the case when both address and data are 8 bit wide, a High in output pin 15 is taken to mean that the lower 8 bit of the address/data lines are data and the higher 8 bits are address.

Still referring to FIG. 6, bits 5, 6 and 7 may be used in combination to give 8 different values. This is used to place the trimming of the time constant of an analog circuit under programmable control. In the peripheral chip system as shown in FIG. 2, the timing signals for internal bus transactions are not derived from external system clock as is usually the case. This asynchronous nature advantageously allows great flexibility in optimizing internal timing in the peripheral chip for interfacing to a host of different devices& The internal bus timing strobes of the peripheral chip, carried by the WRSTBT 66 and RDSTBT 68 lines are derived from an internal monostable multivibrator ('one shot') circuit. These internal strobes are synchronized by the external DS or WR, RD strobes. In particular, the rising edge of the internal write strobe in the WRSTBT line 66 is set by the trailing edge of the external write signal, and the trailing edge of the internal write strobe is used to latch internal registers. The strobe width of the write strobe in the WRSTBT line 66 is set by the time constant of the 'one shot' type circuit in the peripheral chip.

Figure 8:
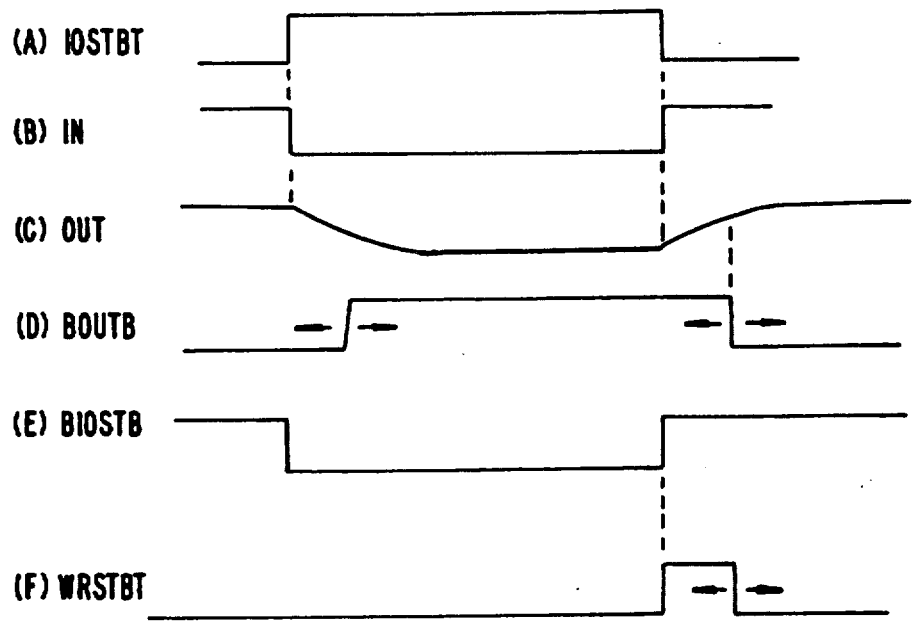
FIGS. 8(A) through 8(F) are timing diagrams of the circuit of FIG. 7.
Figure 7:
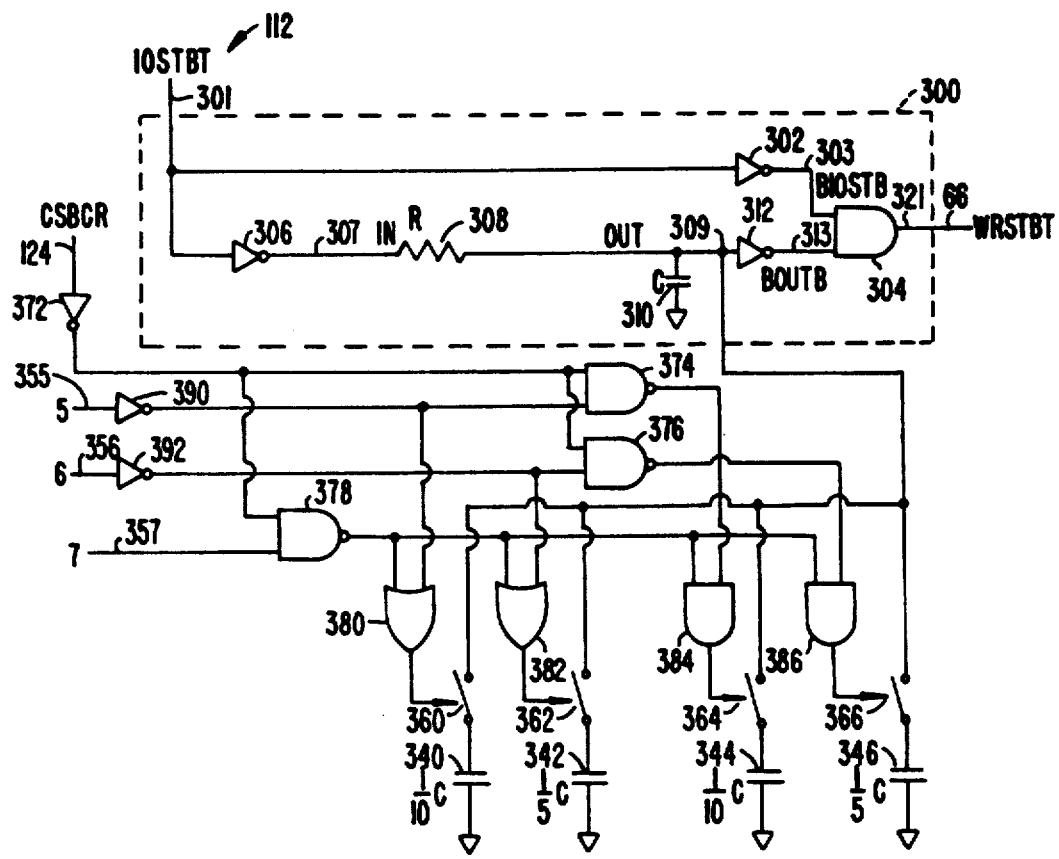
FIG. 7 is an embodiment of the programmable trimming circuit for the monostable multivibrator.

Referring to FIG. 7, the boxed in circuit 300 represents the 'one shot' monostable multivibrator. It is useful for creating a pulse of a definite width which is dependent on the time constant of the circuit. FIG. 7 will be described in conjunction with the timing diagram of FIG. 8. In FIG. 7, the active signal in the IOSTBT line 112 which is derived from external data strobes (see FIG. 3) enters at input 301. The timing of the strobe in the IOSTBT line 112 is shown in FIG. 8(A). Upon entering the input 301, the strobe in the IOSTBT line 112 is split down two paths. In one path, it is inverted by an inverter 302 to become a signal in a BIOSTB line 303, the waveform of which is shown in FIG. 8(E) This serves to disable an AND gate 304 until the trailing edge of the strobe in the IOSTBT line 112 arrives. In the other path, the signal in the IOSTBT line 112 is inverted by an inverter 306 and the signal at an output 307 is shown in FIG. 8(B). The signal then proceeds through an RC circuit comprising a resistor 308 and a main capacitor 310. Whereupon the capacitor 310 gets discharged and the resulting waveform is illustrated in FIG. 8(C). The rate of discharge is dependent upon the RC constant of the RC circuit. The signal emerging out of a junction 309 then gets inverted by an inverter 312 and emerges as a signal in the BOUTB line 313 as illustrated in FIG. 8(D). The strobe in the BOUTB line 313 is essentially that of the IOSTBT line 112 delayed by the RC time constant. The idea is to obtain a pulse with a rising edge defined by the trailing edge of the strobe in the IOSTBT line 112, and with a trailing edge defined by the trailing edge of the delayed version of strobe in the IOSTBT line, namely, that of the BOUTB line 313. As mentioned before, the passage of the signal in the BOUTB line through the AND gate 304 is controlled by that of the BIOSTB line 303. Only when the signal in the BIOSTB line goes High upon the trailing edge of that of the IOSTBT line 112 is the AND gate 304 enabled. The resulting gated signal of the BOUTB line 313 emerges from an output 321 as the strobe carried in the WRSTBT line 66. As can be seen from FIG. 8(A), (D) and (F), the width of the WRSTBT 66 strobe is determined by the RC constant of RC circuit.

Figure 9:
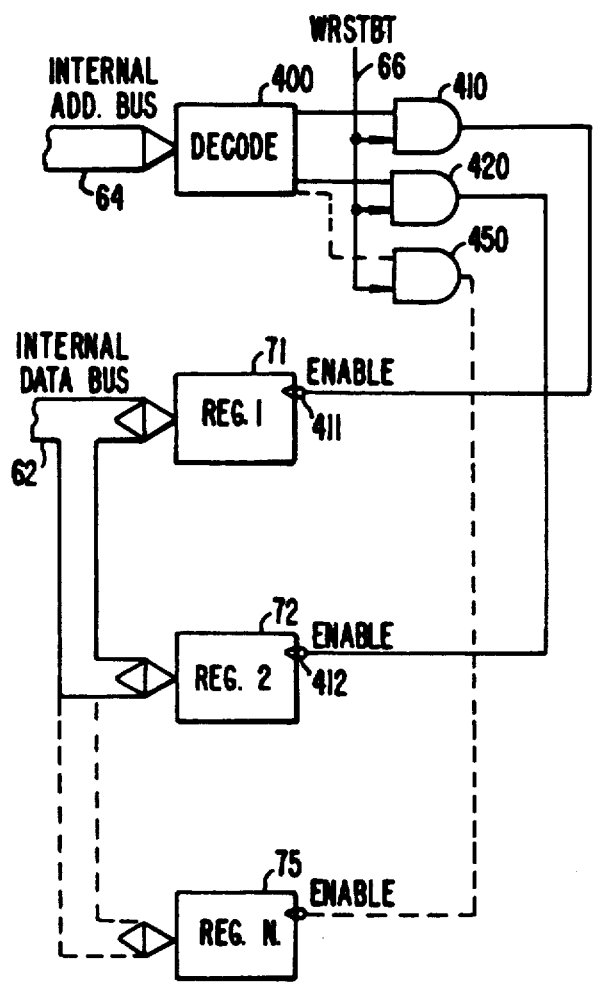
FIG. 9 is an illustration of the function of the write strobe (WRSTBT)

The WRSTBT 66 strobe is used as timing for internal bus transactions of the peripheral chip. FIG. 9 illustrates an example of using the WRSTBT 66 strobe to latch data from the internal bus onto an internal register set. An internal data bus 62 is connected to the set of registers 71, 72, ..., 75. When the internal data is to be written into a particular register, the top register 71 for example, the address of the register 71 is first decoded from the internal address bus 64 by a decoder 400. The address decode enables an AND gate 410 leading to the clock input 411 of the register 71. When the internal write strobe, the WRSTBT 66 strobe, is issued, it passes through the AND gate 410 into the clock input 411 and latches data from the bus 62 into the register 71 with its trailing edge.

Typically circuits whose timings are controlled by monostable multivibrator (one shot) type circuits are dependent on the value of the product of a resistance and capacitance in the RC circuit. Their analog values are in turn critically dependent on the size of the physical components from which the circuit is built. The circuit timing can only be adjusted by physically changing the sizes or types of structures that the circuit is composed of.

When designing circuits whose operation relies on the timing of a 'one shot' type of structure, it is usually necessary to take an iterative, trial-and-error, approach or allow a wide error margin in the device design. The large error margin is dictated by the difficulty in accurately predicting the exact behavior of this type of circuit. The difficulty arises from the large influence that parasitic elements (whose precise control is not usually necessary for non 'one shot' type circuits) have on the operation of 'one shots'. This precludes the use of 'one shots' in circuits where there are stringent timing requirements or where the cost of iteration is prohibitive.

Prior art methods have employed banks of extra components which can be selective switched off from the main component which value is to be trimmed. The selective switching of these existing circuits is typically irreversible, performed by physically opening certain circuit paths in the integrated circuit. Common techniques are laser trimming or burning of circuit fuses under program control.

One feature of the present invention makes it possible to adjust the timing of a 'one shot' by software programmable control. The ease of adjustment of the timing of the circuit makes it possible to allow for a wider error margin and save on the cost of iterations in the design while using 'one shot' type circuits.

Referring again to FIG. 7, in order to adjust the timing of the 'one shot' monostable multivibrator 300, either the value of the resistor 308 or the capacitor 310 could be adjusted. In the preferred embodiment, the value of the capacitor 310 is adjusted by programmable control in accordance with the combinations formed from three of the control bits of the control register. The capacitor is allowed to take on different values by selectively shunting it with one or more trimming capacitors. In the preferred embodiment four trimming capacitors 340, 342, 344 and 346 are used. Two of the capacitors 340, 344 are of value one-tenth of the value of the main capacitor 310, and the other two capacitors 342, 346 are of value one fifth of the value of the main capacitor 310. Each one of these capacitors, by itself or in combination with others, can be switched on to shunt the main capacitor 310.

The shunting of the main capacitor 310 by any of the trimming capacitors 340, 342,,344 and 346 is effected by four MOSFET switches 360, 362, 364, 366 respectively. Each MOSFET switch will close when a High appears in the input and will open when a Low appears. In the preferred embodiment, the product of current and resistance of the MOSFET switches is at least a factor of four smaller than that of the main resistor in the RC circuit. This design restriction is a result of keeping the main resistor in the RC circuit as independent of active device resistance as possible.

The binary weighting on the size of the trimming capacitors makes it possible to obtain seven different shunting configurations. In the default case, two of the capacitors 340, 342 are both shunted onto the main capacitor 310. The default timing can be reduced in three gradations by decoupling only the capacitor 340 or only the other capacitor 342 or decoupling both of the capacitors 340, 342. On the other end, the default timing can also be increased in three gradations by progressively shunting only the capacitor 344 or only the other capacitor 346 or both capacitors 344, 346. Each of these configurations corresponds to some combinations formed from the three control bits of the control register available respectively from (see FIG. 6) pin 5, pin 6 and pin 7 of the control register output 103. The output pins 5, 6, 7 are connected to the circuit of FIG. 7 through the inputs 355, 356 and 357 respectively.

Before further description of the trimming circuit of FIG. 7, it is expedient to note that there is another input to the circuit, namely the CSBCR line 124. Recalling from an earlier discussion of the control register and circuit of FIG. 3, an active High in the CSBCR line 124 enables the control register 100. It is active High after system reset, just prior to the writing of the control register. The idea of introducing the CSBCR input 124 into the circuit of FIG. 7 is to jam-load the circuit so that all trimming capacitors are used to shunt across the main capacitor 310. This ensures a maximum pulse width for the WRSTBT 66 strobe. Thus during the first access of the control register, the internal timing is forced to the most relaxed state to allow a device with a worst case error to still get programmed properly. In other words, a default timing with maximum latitude is used to first get the control parameters into the control register, control parameters which include ones that will specify the subsequent timing of the device internal bus. Thus in the special case of first access to the device, the CSBCR input 124 will go High. This signal is then inverted by an inverter 372 and forces the output of three NAND gates 374, 376 and 378 to High. This in turn forces High the output of OR gates 380, 382, and AND gates 384, 386. Since these High outputs control and close MOSFET switches 360, 362, 364 and 366, all capacitors are therefore shunted onto the main capacitor 310.

In the normal case after initial reset, the signal in the CSBCR line 124 will be returned to Low. After this has propagated through the inverter 372, it serves to enable NAND gates 374, 376 and 378, and turns them effectively into inverters as far as the other inputs to each of the gates are concerned.

Inputs 355, 356 and 357 are connected to outputs 103 of the control register (see FIG. 6), in particular to output pins 5, 6 and 7 respectively. Two groups of input combinations are distinguished, depending on the state of the input 357 (output pin 7 of control register). When the input 357 is Low, a High appears at the output of the NAND gate 378. This will always turn on the two OR gates 380 and 382 so that the corresponding trim capacitors 340 and 342 will always be shunted onto main capacitor 310. At the same time, the High output of the NAND gate 378 also enables the two AND gates 384 and 386. This means that a signal appearing at the input 355 after it has been inverted twice by an inverter 390 and the NAND gate 374 will be the same signal going into enabled NAND gate 384. Similarly the signal appearing at the input 356 will be the same signal going into the enabled NAND gate 386 after having been inverted twice by an inverter 392 and the NAND gate 376. Thus a High at the input 355 will shunt the trimming capacitor 344 onto the main capacitor 310, and a Low will decouple it. The same is true for the input 356 relating to the trimming capacitor 346.

The second group of input combinations occurs when the input 357 is High. The input High then gets inverted by the NAND gate 378 to Low which then disables AND gates 384 and 386. This means irrespective of the other two inputs 355 and 356, trimming capacitors 344 and 346 are decoupled from main the capacitor 310. However, the Low output of NAND gate 378 will not in itself affect the switching of trimming capacitors 340 and 342. The switching will now be dependent on the states at inputs 355 and 356. When the input 355 is Low, after propagating through an inverter 390, a High signal enters the OR gate 380 and closes the MOSFET switch 360 to shunt the trimming capacitor 340 onto the main capacitor 310. On the other hand if the input 355 is High, the trimming capacitor 340 will be decoupled from the main capacitor 310. The same is true for the input 356 when applied to the trimming capacitor 342.

In this way by suitable choice of three bits of the control register, it is possible to control the coupling or decoupling of the four trimming capacitors 340, 342, 344 and 346 thereby obtaining seven gradations of value for the capacitor in the one shot circuit 300.

Another application of the control register of the invention is the use of one of its bits (for example, bit 3 as shown in FIG. 6) to control a circuit which allows external control of internal bus timing strobes. Available integrated circuits only allow control of the external bus timings. In cases where the device internal bus timing is derived from the external system clock, control of internal timing follows from that of external timing. However, for those devices with independent, asynchronous, internal bus timing, such as the peripheral chip, where the internal bus timings of the device need to be altered either for debugging the device or for upgrade of the device, it is necessary to use microprobing techniques to accomplish the desired alterations.

This aspect of the invention allows external control of internal bus timing strobes. This new addition to access and control of the internal bus timing strobes eliminates most of the need to microprobe a new design. It also allows more accurate information to be obtained about the actual performance of a device. Among other things, this allows easier design upgrades to be made to a device. Another important use of this new feature is that it allows internal device strobes that are controlled by 'one shots' to be held active longer than they normally would be. This allows accurate testing of the circuits whose interactions are important only when the internal strobes are active. Without the external control of the internal strobes, it would be very difficult to guarantee that certain interactions had been tested properly.

Figure 10:
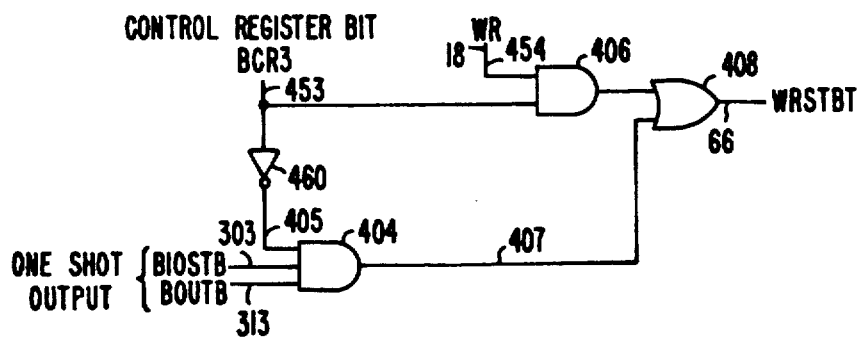
FIG. 10 shows the replacement of the internal timing strobe by an external strobe through an external pad.

FIG. 10 shows the replacement of the internal timing strobe, normally produced with the 'one shot' monostable multivibrator, by an external strobe input through an external pad. Recalling from FIG. 7, the internal strobe carried in the WRSTBT line 66 results from the output of the 'one shot' circuit 300. In particular it is formed by combining the signals in the BIOSTB line 303 and the BOUTB line 313 through the AND gate 304. According to one aspect of the invention, a control bit (for example, bit 3 of the control register as shown in FIG. 6) can be used to turn off the 'one shot's' output and at the same time allow a substitute strobe signal to be input from one of the external pads.

FIG. 10 illustrates the circuit diagram of such a scheme. The two-input AND gate 304 of FIG. 7 which formed the output stage of the 'one shot' is now replaced by a three-input AND gate 404 in FIG. 10. The third input 405 is added to enable or disable the gate 404. In other words, the new gate 404 is the modification of output gate 304 of the original 'one shot' with an enable line 405. The gate input 405 essentially derives its signal from the output pin 3 of the control register (see FIG. 6). The signal from the output pin 3 of the control register enters the circuit of FIG. 10 through an input 453 whereupon it is split down two paths. It goes down one path through an inverter 460 and goes on to enable or disable the AND gate 404, depending on whether the input 453 is Low or High. Going down the other path, the signal from the input 453 enables or disables the passage of external strobe signal in the WR line 18 through the AND gate 406. Thus, under normal circumstances, the input 453 is Low, and it enables the AND gate 404 and disables the AND gate 406, thereby allowing the WRSTBT line 66 to derive its signal from the output 407 of the 'one shot' through the OR gate 408. On the other hand, under test mode, the input 453 is High which disables the AND gate 404 and enables the AND gate 406, thereby allowing the WRSTBT line 66 to derive its signal from the external pad 454. In the preferred embodiment, the external pad 454 is the WR 18 pad shown in FIG. 2.

Another application of the control register is to use one of the bits (for example bit 4 as shown in FIG. 6) to control a circuit for output of internal bus timing control signals.

Available integrated circuits do not allow internal bus timing strobes to be output from a device pin. In cases where the internal bus timings of the device need to be observed either for debugging the device or for upgrade of the device, it is necessary to use microprobing techniques to observe the desired signals.

One aspect of the present invention is to make available internal bus timing control signals on one of the device output pins, when one of the bits of the control register is set. This new addition to access of the internal bus timing control strobes eliminates most of the need to microprobe a new design to observe internal bus timing control strobes. It also allows more accurate information to be obtained about the actual performance of a device. Among other things, this allows easier design upgrades to be made to a device.

Figure 11:
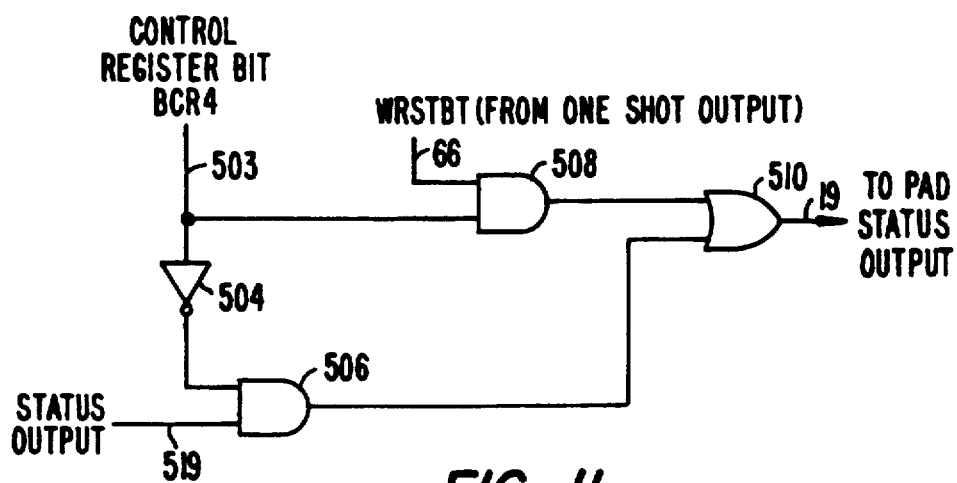
FIG. 11 shows the output of the internal timing strobe through the status output pad.

FIG. 11 shows the circuit for output of internal bus timing control signals. Essentially the circuit acts as a multiplexer in response to an input 503 to switch either the status output line 519 or the WRSTBT line 66 to the external pad 19. The input 503 is connected to the output pin 4 of the control register (see FIG. 6). Under normal circumstances, the input 503 is Low and it enables through an inverter 504 an AND gate 506. At the same time it disables an AND gate 508. Thus status output line 519 normally passes through the AND gate 506 and the OR gate 510 to the output pad 19. At the same time the internal strobe in the WRSTBT line 66 is blocked by the AND gate 508 from getting through to the pad 19. Under test or diagnostic mode, the input 503 is High and it disables through the inverter 504 the AND gate 506 and enables the AND gate 508. Thus status output line 519 is blocked by the AND gate 506 from getting through to the output pad 19. At the same time the internal bus timing strobe in the WRSTBT line 66 is allowed to pass through the AND gate 508 and the OR gate 510 to the output pad 19. In the preferred embodiment, the output pad 19 is the status output pad 19 shown in FIG. 2.

Although the description of the various treatments of the internal bus timing strobe has used the write strobe in WRSTBT line 66 as an example, the use of the read strobe in RDSTBT line 68 is equally applicable.

Another application of the control register is by setting one of the register bits (for example, bit 14 as shown in FIG. 6) to put the device chip into a special test mode by allowing all output drivers to be turned off using a very simple procedure.

One important measurement that is used to determine if electrostatic discharge damage is present in the device is a junction leakage test on all IC pins when the output drivers are turned off. This circuit allows this test to be performed with simple bench test equipment such as a DC power supply, an IC test box (an IC socket with switches to allow each pin to be opened or connected to the positive or negative supply), and a transistor curve tracer (optionally a digital volt meter and a controllable current source). This circuit also allows the measurement mentioned above to be performed much easier on IC test equipment. In prior art method, typically different IC's have special input sequences that must be followed in order to get output pins into a specific state for performing parametric type measurements. These test sequences are typically very different for different ICs and in some cases the IC cannot be driven to the state necessary for some types of tests. In the cases where the IC can be driven to the proper state, the input sequence necessary cannot be generated without using expensive and dedicated IC test equipment.

Figure 12:
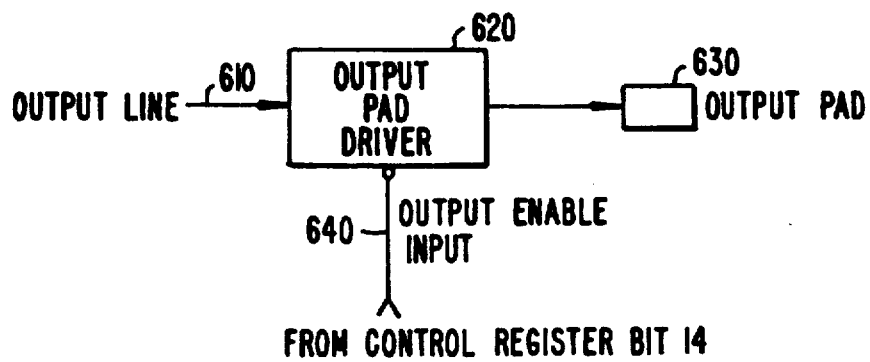
FIG. 12 shows a circuit to turn off the outputs of the output pad drivers connected to output pins.

FIG. 12 shows a simple way of implementing this aspect of the invention. An output pad driver 620 which drives from an output line 610 to an external pad 630 has an output enable input 640. The output enable input 640 is connected to the register bit 14 of the control register (see FIG. 6). In the normal case, the enable input 640 is Low and enables the output pad driver 620 thereby allowing output signal in the output line 610 to go through to the external pad 630. On the other hand, in the test mode, the enable input 640 is set High. This disables the output pad driver 620 and floats its output, thereby putting it in an open state and allowing junction leakage tests to be performed easily. In the preferred embodiment, the output enable inputs of all the output pad drivers are tied to the output of the register bit 14 of the control register allowing all the output pads to be floated simultaneously.

Figure 13:
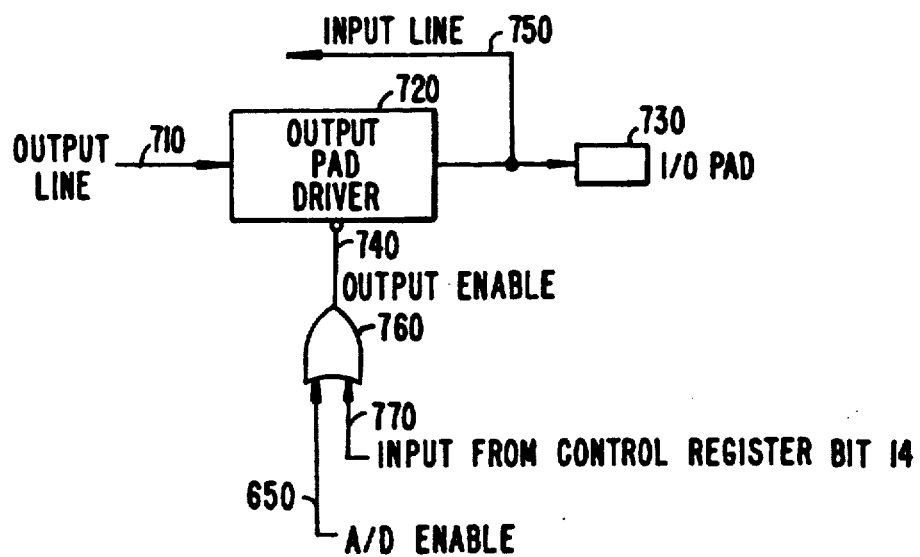
FIG. 13 shows a circuit to turn off the outputs of the output pad drivers connected to input/output pins.

FIG. 13, which is a variation of FIG. 12, applies to the case for Input/Output pads. For these pads, where signals may flow in or out, an A/D enable line 650 is used to multiplex the signal flow to and from an external pad 730. As before, for an output signal 710 to drive an output pad driver 720 to a pad 730, the output enable input 740 of the pad driver 720 must be active Low. In the case where the pad 730 is used as an output pad, the A/D enable line 650 is set Low, which propagates through an OR gate 760 to enable the pad driver 720. In the case when the pad 730 is used as an input pad, the A/D enable line 650 is set High, which propagates through the OR gate 760 to disable the pad driver 720. This has the effect of floating the output of the pad driver so that incoming signals will not be affected as they enter the input line 750. The device may be put into a test mode by setting the A/D enable line 650 High so that output gate leakage tests may be performed easily. However, this is not always convenient. The present invention allows programmable control by having the output enable input 740 also responsive to one of the control bits of the control register (e.g. bit 14 of the control register shown in FIG. 6). The output of the control register is connected to an input 770 through the OR gate 760 to the output enable input 740. Normally, the input 770 is set Low which enables line 650 to control the output enable line 740. The pad driver 720 can be floated either when the A/D enable line 650 is High or the input 770 is High. The test mode is most conveniently entered into by setting the input 770 High by means of the programmable control register of the invention.

Although the various aspects of the present invention have been described with respect to its preferred embodiment, it will be understood that the invention is to be protected within the scope of the appended claims.

We claim:

1. In a computer system having a microprocessor chip and a plurality of additional individual circuit chips connected together through a system bus and control lines, at least one of said additional individual circuit chips having an internal control register, said register being loaded with control bits from said system bus in response to initialization of said computer system, the improvement comprising:

means within said at least one of said chips that is responsive to signals in said control lines for enabling loading of said internal control register with control bits from said system bus in response to said initialization of said computer system;

means within said at least one of said chips for providing a timing pulse to said other circuits, said timing pulse providing means including means responsive to a group of one or more of said control bits loaded in said control register for setting a duration of said timing pulse;

means responsive to said internal control register being loaded with control bits for disabling said loading means until a subsequent initialization of said computer system; and said microprocessor providing software control of the control bits loaded into said control register and thus the duration of said timing pulse, wherein said at least one of said additional individual circuit chips includes at least one conductive pin extending outward of said at least one of said chips and connected to a circuit portion thereon that includes means responsive to a group of one or more of said control bits when loaded in said control register for connecting the pin to receive the timing pulse, thereby allowing the timing pulse to be measured from outside the at least one of said chips.

2. In a computer system having a microprocessor chip and a plurality of additional individual circuit chips connected together through a system bus and control lines, at least one of said additional individual circuit chips having an internal control register, said register being loaded with control bits from said system bus in response to initialization of said computer system, the improvement comprising:

means within said at least one of said chips that is responsive to signals in said control lines for enabling loading of said internal control register with control bits from said system bus in response to said initialization of said computer system;

means within said at least one of said chips for providing a timing pulse to said other circuits, said timing pulse providing means including means responsive to a group of one or more of said control bits loaded in said control register for setting a duration of said timing pulse;

means responsive to said internal control register being loaded with control bits for disabling said loading means until a subsequent initialization of said computer system; and said microprocessor providing software control of the control bits loaded into said control register and thus the duration of said timing pulses wherein said at least one of aid additional individual circuit chips includes within said at least one of said chips at least one conductive pin extending outward of said at least one of said chips and connected to a circuit portion thereon that includes means responsive to a group of one or more of said control bits when loaded in said control register for disconnecting said timing pulse from said other circuits and connecting said other circuits to said at least one pin extending outward of said at least one of said chips, thereby allowing an externally generated pulse to be substituted for that of the means for providing a timing pulse during testing of the at least one of said chips.

3. In a computer system having a microprocessor chip and a plurality of additional individual circuit chips connected together through a system bus and control lines, at least one of said additional individual circuit chips having an internal control register, said register being loaded with control bits from said system bus in response to initialization of said computer system, the improvement comprising:

means within said at least one of said chips that is responsive to signals in said control lines for enabling loading of said internal control register with control bits from said system bus in response to said initialization of said computer system;

means within said at least one of said chips for providing a timing pulse to said other circuits, said timing pulse providing means including means responsive to a group of one or more of said control bits loaded in said control register for setting a duration of said timing pulse;

means responsive to said internal control register being loaded with control bits for disabling said loading means until a subsequent initialization of said computer system; and said microprocessor providing software control of the control bits loaded into said control register and thus the duration of said timing pulse wherein said means for providing a timing pulse includes a one-shot monostable multivibrator having permanently connected resistance and capacitance circuit elements, and wherein said timing pulse duration setting means includes a plurality of additional capacitance elements and switching logic means responsive to said group of one or more bits within said control register for selectively connecting said additional capacitance elements with the permanently connected capacitance element of said multivibrator circuit, thereby permitting control of a total effective capacitance of said permanent capacitance circuit elements and said selectively connected additional capacitance elements, wherein the duration of said timing pulse depends upon the permanently connected resistance and said total effective capacitance.

4. The improved system according to claim 1, wherein said control lines include at least reset, chip select and write strobe signal lines, wherein said computer system sends a reset signal on said reset line upon initiation of the computer system, and wherein said control register enabling means includes:

means responsive to said reset signal on said reset line and a chip select signal on said chip select signal line for enabling the loading of said register, means responsive to a write strobe signal on said write strobe signal line for causing the enabled register to be U.S. Pat. application Ser. No. 742,152. loaded with a digital signal existing on said system bus, and means responsive to said write strobe signal on said write strobe signal line for disabling said register loading enabling means until said register loading enabling means receives another reset signal.

* * * * *

UNITED STATES PATENT AND TRADEMARK OFFICE
CERTIFICATE OF CORRECTION

PATENT NO.  :   5,193,199
DATED       :   March 9, 1993
INVENTOR(S) :   Dalrymple et al.

It is certified that error appears in the above-identified patent and that said Letters Patent is hereby corrected as shown below:

Column 14, line 58, in Claim 2:     Replace "pulses" with --pulse,--

Column 14, line 59, in Claim 2:     Replace "aid" with --said--

Column 15, line 30, in Claim 3:     Insert --,-- after "pulse"

Column 16, line 15, in Claim 4:     Delete the "," after "claim 1"

Column 16, lines 26-27,
    in Claim 4:                     Delete "U.S. Pat. application Ser. No. 742,152."

Signed and Sealed this

Eleventh Day of January, 1994

Attest:

BRUCE LEHMAN

*Attesting Officer*            *Commissioner of Patents and Trademarks*